(12) United States Patent  (10) Patent No.: US 6,396,744 B1
Wong  (45) Date of Patent: May 28, 2002

(54) FLASH MEMORY WITH DYNAMIC REFRESH

(75) Inventor: Sau Ching Wong, Hillsborough, CA (US)

(73) Assignee: Multi Level Memory Technology, San Jose, CA (US)

(*) Notice: Subject to any disclaimer, the term of this patent is extended or adjusted under 35 U.S.C. 154(b) by 0 days.

(21) Appl. No.: 09/558,477

(22) Filed: Apr. 25, 2000

(51) Int. Cl.$^7$ ............................................. G11C 16/06
(52) U.S. Cl. ........................ 365/185.25; 365/185.22; 365/185.33
(58) Field of Search ............... 365/185.03, 185.08, 365/185.22, 185.33, 185.25; 711/202

(56) References Cited

U.S. PATENT DOCUMENTS

| | | | |
|---|---|---|---|
| 3,858,184 A | * 12/1974 | DeVries | 365/222 |
| 3,866,188 A | * 2/1975 | Watanabe | 365/222 |
| 4,964,079 A | 10/1990 | Devin | |
| 5,031,147 A | 7/1991 | Maruyama | |
| 5,043,940 A | 8/1991 | Haran | |
| 5,095,344 A | 3/1992 | Haran | |
| 5,163,021 A | 11/1992 | Mehrotra et al. | |
| 5,172,338 A | 12/1992 | Mehrotra et al. | |
| 5,239,505 A | 8/1993 | Fazio et al. | |
| 5,293,560 A | 3/1994 | Horan | |
| 5,305,486 A | 11/1994 | Schreck | |
| 5,394,359 A | 2/1995 | Kowalski | |
| 5,422,845 A | 6/1995 | Ong | |
| 5,424,978 A | 6/1995 | Wada et al. | |
| 5,508,958 A | 4/1996 | Fazio | |
| 5,521,665 A | 5/1996 | Ohuchi et al. | |
| 5,539,690 A | 7/1996 | Talreja et al. | |
| 5,673,221 A | 9/1997 | Calligaro et al. | |
| 5,680,341 A | 10/1997 | Wong et al. | |
| 5,682,352 A | 10/1997 | Wong et al. | |
| 5,694,356 A | 10/1997 | Wong et al. | |
| 5,689,465 A | 11/1997 | Sukegawa et al. | |
| 5,485,422 A | 1/1998 | Baue et al. | |
| 5,745,409 A | 4/1998 | Wong et al. | |
| 5,748,533 A | 5/1998 | Dunlap et al. | |
| 5,748,534 A | 5/1998 | Dunlap et al. | |
| 5,761,125 A | 6/1998 | Himomo | |
| 5,801,980 A | 9/1998 | Wong et al. | |
| 5,815,425 A | 9/1998 | Wong et al. | |
| 5,818,757 A | 10/1998 | So et al. | |
| 5,826,616 A | 10/1998 | Bauor et al. | |
| 5,859,858 A | 1/1999 | Leeman | |
| 5,880,996 A | 3/1999 | Roohparvar | |
| 5,896,340 A | 4/1999 | Wong et al. | |
| 5,909,387 A | 6/1999 | Wong et al. | |
| 5,909,449 A | 6/1999 | So et al. | |
| 5,912,846 A | 6/1999 | Taylor | |
| 5,920,507 A | 7/1999 | Takeuchi et al. | |
| 5,923,565 A | 7/1999 | Wong et al. | |

(List continued on next page.)

*Primary Examiner*—Vu A. Le
*Assistant Examiner*—VanThu Nguyen
(74) *Attorney, Agent, or Firm*—David T. Millers

(57) ABSTRACT

A multi-bit-per-cell non-volatile memory periodically reads and rewrites data and thereby refreshes threshold voltages and removes the effects of threshold voltage drift. Accordingly, threshold voltages are kept in narrower ranges, and the narrow ranges allow more distinct levels for data values and allows storage of more bits per cell. A refresh interval is according to the size of windows for different multi-bit values and the measured or expected rate of threshold voltage drift. An on-chip refresh timer and arbitration logic selects when to initiate a refresh operation. A refresh can use a data buffer for temporary storage or can directly write data from one memory location to another. A memory mapping circuit in the memory adjusts for different storage configuration that the refresh operations create. In particular embodiments, shifts sectors-sized data blocks cyclically among sectors in an array, a bank, or an entire memory or alternatively shifts the data blocks between two configurations.

9 Claims, 6 Drawing Sheets

U.S. PATENT DOCUMENTS

| | | |
|---|---|---|
| 5,943,283 A | 8/1999 | Wong et al. |
| 5,949,715 A | 9/1999 | Wong et al. |
| 5,950,224 A | 9/1999 | Davin |
| 5,969,986 A | 10/1999 | Wong et al. |
| 6,038,166 A | 3/2000 | Wong |
| 6,044,004 A * | 3/2000 | Kramer ................. 365/185.03 |
| 6,058,060 A | 5/2000 | Wong |
| 6,091,388 A | 7/2000 | Wong |
| 6,091,631 A | 7/2000 | Kucera et al. |
| 6,091,637 A | 7/2000 | Hakozaki |
| 6,134,141 A | 10/2000 | Wong |
| 6,134,145 A | 10/2000 | Wong |
| 6,141,244 A | 10/2000 | Pawletko et al. |
| 6,149,316 A | 11/2000 | Harran et al. |
| 6,151,246 A | 11/2000 | So et al. |
| 6,160,739 A | 12/2000 | Wong |
| 6,205,057 B1 | 3/2001 | Pan |
| 6,208,542 B1 | 3/2001 | Wang |
| 6,219,276 B1 | 4/2001 | Parker |
| 6,222,762 B1 | 4/2001 | Gutorman |
| 6,233,175 B1 | 5/2001 | Wang et al. |
| 6,240,032 B1 * | 5/2001 | Fukumoto .............. 365/185.11 |

* cited by examiner

FLASH MEMORY WITH DYNAMIC REFRESH

BACKGROUND

1. Field of the Invention

This invention relates to non-volatile semiconductor memory and to methods for maintaining accurate storage of data in a non-volatile semiconductor memory.

2. Description of Related Art

A conventional non-volatile memory such as a Flash memory has memory cells that include floating gate transistors. Each floating gate transistor stores data as charge trapped on an isolated floating gate. The charge trapped on the floating gate transistor determines the threshold voltage of the floating gate transistor, and a data value can be written to or read from a memory cell by setting or determining the threshold voltage of the floating gate transistor in the memory cell. If the methods for setting and determining threshold voltages are sufficiently accurate and dependable, multiple bits of data can be stored in each memory cell.

Time-dependent and voltage-dependent charge leakage from or onto the floating gate of a memory cell can change the threshold voltage of the memory cell. Voltage-dependent usually leakage results from programming or other operations on neighboring memory cells. Time-dependent charge leakage generally depends on the temperature of a memory circuit but occurs even when the memory is not accessing (i.e., erasing, programming, or reading) any memory cells. Conventionally, retention of stored data requires minimizing the charge leakage to maintain the threshold voltages of memory cells that store data and/or tracking changes in the threshold voltages.

Tracking circuits can use reference cells that are subject to charge leakage that is similar to memory cells storing data, and a comparison of a memory cell and a reference cell can indicate a correct data value even if the threshold voltages have changed. Such tracking circuits can also track changes in measured threshold voltages that result from differences in operating parameters such as the supply voltage or temperature for the memory. However, tracking circuits cannot track changes in threshold voltage for every memory cell with complete accuracy. Accordingly, each data value corresponds to a range of threshold voltages, and that range must be made sufficiently wide to cover variations in the threshold voltages representing the same data value. Since the full usable range of threshold voltages of a memory cell is limited, having a wide range for each data,value reduces the number of bits that can be stored per memory cell. Accordingly, methods and circuits are sought for maintaining threshold voltages within narrow windows to ensure data integrity over time.

SUMMARY

In accordance with the invention, a non-volatile memory has an on-chip "refresh" capability, that periodically reads and rewrites the content of all or a portion of a memory. More particularly, a refresh operation reads the content of each memory cell and writes the read value back into the same or a different location in the memory. The refresh operation is performed before the memory cells' threshold voltages have drifted to a level that could cause an error when read. Accordingly, the value read is the value originally written, and rewriting that value removes the effect of any threshold voltage drift that occurred prior to the refresh operation. The time interval between refresh operations can be determined according to: the storage density per cell, i.e., the number of bits stored per cell; the allowable budget for threshold voltage drift without causing error; and charge-loss and charge-gain characteristics of the memory cells (per reliability test results).

In an exemplary embodiment, the refresh operation can read and rewrite data without the need for any additional external components. For example, data read from one sector of non-volatile memory cells can be directly written into a previously-erased sector of non-volatile memory cells. Alternatively, data read from a sector is temporarily stored in an on-chip buffer, the sector is erased, and data is rewritten back into the same locations.

One embodiment of the invention is a non-volatile memory that includes: memory cells (typically arranged in multiple arrays); erase, write, and read circuitry; a refresh timer; and a memory management unit. In response to a signal from the refresh timer, as asserted by arbitration logic, the memory management unit directs the erase, write, and read circuitry to perform a refresh operation. In particular, the refresh operation includes reading data without generating a data signal for output from the non-volatile memory and writing the data to refresh threshold voltages of memory cells storing the data. An address mapping circuit can be used when the refresh operation moves data around within the memory. For example, before a refresh operation, the address mapping circuits converts a logical or virtual address corresponding to data to a first physical address. After the refresh operation, the address mapping circuits converts the virtual address signal corresponding to the data to a second physical address. The memory management unit optionally includes a data buffer that the memory management unit uses for data externally transferred and for the data read during the refresh operation for writing back into the memory cells.

Another embodiment of the invention is a method for operating a non-volatile memory. The method includes: storing data in the memory cells of the non-volatile memory, wherein each memory cell has a threshold voltage representing a multi-bit value; and periodically refreshing the threshold voltages representing the data by reading the data and rewriting the data. Periodically refreshing includes: determining a time since a last refresh operation; and performing a refresh operation if the time is greater than a predetermined refresh interval. The refresh interval is less than a ratio of a maximum tolerable drift for threshold voltages representing the data and an expected rate of drift of the threshold voltage.

In a non-volatile memory such as a Flash memory, a sector-based refresh operation includes: (a) selecting a sector that is designated as containing invalid data; (b) erasing the selected sector; (c) reading a following sector; (d) writing data from the following sector, to the selected sector; and (e) designating the following sector as containing invalid data. The following sector follows the selected sector in an ordering (e.g., a cyclic ordering) of sectors of the non-volatile memory. One or more repetition of steps (b), (c), and (d) uses as the selected sector for that repetition, the following sector last used. In a refresh of a single array, the read operations for memory cells in the following sector and write operations to memory cells in the selected sector are interleaved. When the selected and following sectors are in different arrays, reading, writing, and erasing can be performed in parallel. For example, reading from one array and simultaneously writing to another array. In one embodiment, for each repetition except a last of the repetitions, reading and writing for one repetition are simultaneous with erasing for a following repetition.

In another embodiment, a first repetition simultaneously erases the selected sector and reads data from the following sector into a buffer. The writing of data from the buffer to the selected sector is simultaneous with erasing the following sector for the next repetition. In that next repetition, reading data from the following sector and writing data to the select sector are simultaneous.

Another method for operating a non-volatile memory in accordance with an embodiment of the invention, includes: performing a first refresh operation that reads data from a first location having a first physical address in the non-volatile memory and writes the data to a second location having a second physical address in the memory; operating the memory using a first address mapping that maps a logical address corresponding to the data to the second physical address; performing a second refresh operation that reads the data from second locations in the non-volatile memory and writes the data to first locations in the memory; and operating the memory using a second address mapping that maps the logical address corresponding to the data to the first physical address.

Yet another aspect of the invention is the use of a buffer in a refresh operation that changes the location of data. One such embodiment of the invention includes: reading first and second data from respective first and second locations in the non-volatile memory; erasing the first and second locations; writing the first data in the second location; and writing the second data in the first location. When the first location is in a first array and the second location is in a second array, reading the first and second data can be simultaneous, erasing the first and second locations can be simultaneous, and writing the first and second data can be simultaneous.

BRIEF DESCRIPTION OF THE DRAWINGS

FIGS. 2A, 2B, and 2C illustrate refresh operations performed in one or more arrays of the memory of FIG. 1.

Use of the same reference symbols in different figures indicates similar or identical items.

DETAILED DESCRIPTION

A non-volatile memory performs an internal refresh operation to refresh the threshold voltages representing data before charge leakage or other effects that change threshold voltages and could cause a data error. Accordingly, the multi-bit-per-cell non-volatile memory can employ smaller threshold voltage windows for data values and can store more bits per cell without encountering errors caused by threshold voltage drift. The refresh operation can be used with tracking circuit that allow further narrowing of threshold voltage windows for data values, or the tracking circuitry can be eliminated or reduced in complexity since the refresh operation compensates for charge leakage.

Figure 1:
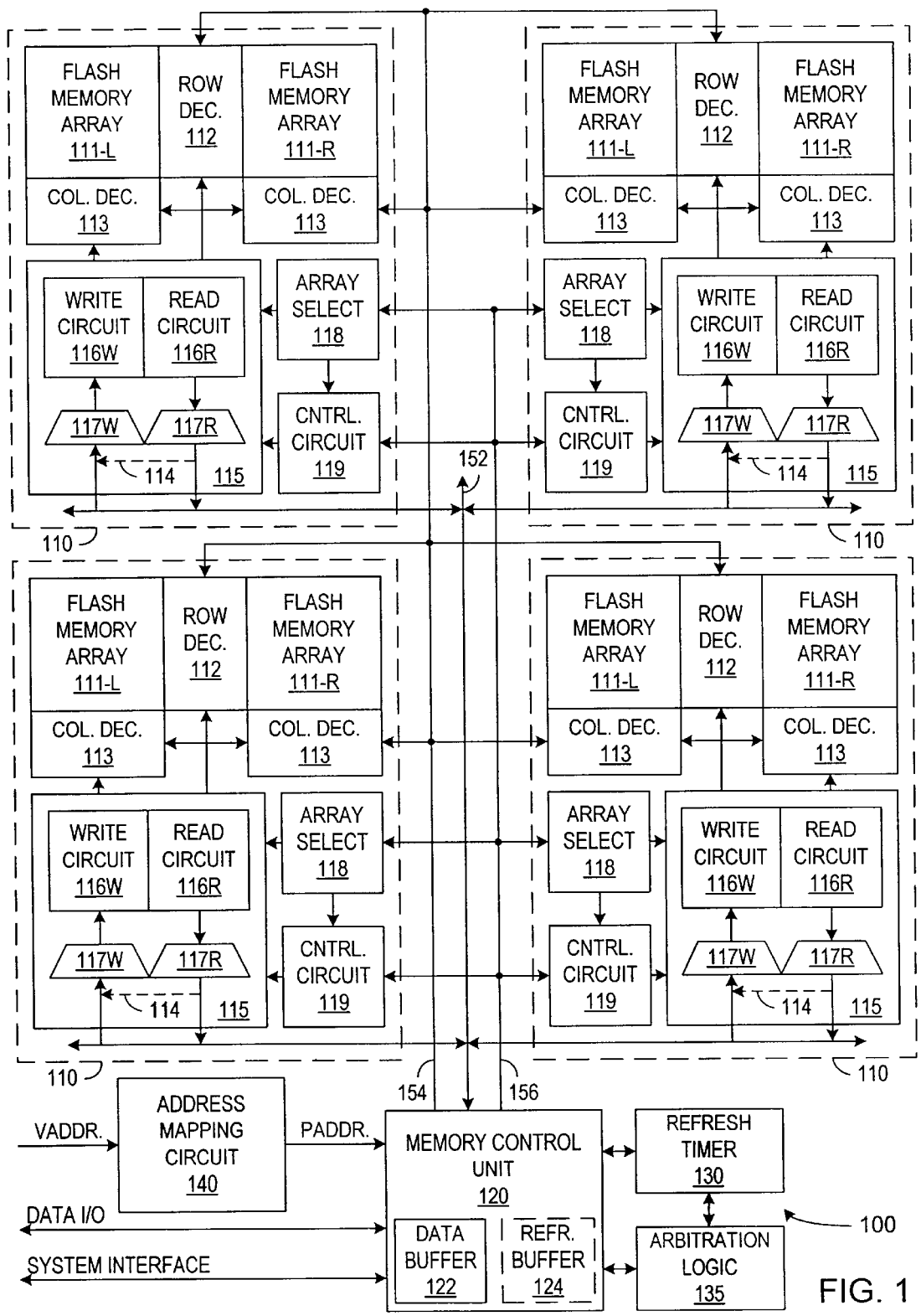
FIG. 1 is a block diagram of a non-volatile memory in accordance with an embodiment of the present invention.

FIG. 1 is a block diagram of a multi-bit-per-cell Flash memory 100 in accordance with an embodiment of the invention. Memory 100 is suitable for conventional random access operation and for recording and playing back serial data streams. Such data streams are common in digital voice recording systems, digital music systems, and digital cameras. For a record operation, data from a data stream is sequentially written at sequential addresses in one or more memory sectors. For a playback operation, memory cells are sequentially read from sectors storing the data stream.

Memory 100 includes multiple memory banks 110 containing memory arrays 111. In FIG. 1, each memory bank 110 contains two memory arrays 111. Alternatively, each memory bank 110 could include a single memory array 111 or more than two memory arrays 111. Each memory array 111 includes rows and columns of memory cells. Each memory cell can be a conventional Flash memory cell (e.g., a floating gate transistor), an EEPROM cell, or an EPROM cell. Row lines (not shown) connect a row decoder 112 to the control gates of memory cells in the rows of associated memory arrays 111. In FIG. 1, the two memory arrays 111 in a memory bank 110 are isolated from each other but share a row decoder 112. Column lines (not shown) connect sense amplifiers and a column decoder 113 to drains of memory cells in the columns of memory array 111. Each array 111 is further divided into erasable sectors, and a source line connects to the sources of memory cells in an associated sector. The implementations of each array 111 and the associated row and column decoders 112 and 113 can be conventional for a binary Flash memory or a multi-bit-per-cell Flash memory.

Each memory bank 110 also includes erase/write/read circuit 115, a control circuit 119, and a bank selection circuit 118. A global data bus 152, a global address bus 154, and a bank control bus 156 respectively provide data signals, address signals, and control signals from a memory control unit 120 to memory banks 110. A system interface provides for input of data, address, and control signals from outside memory 100, for control of memory 100.

In an exemplary embodiment of the invention, memory 100 is a multi-bit-per-cell Flash memory. The number of bits stored per memory cell can be uniform throughout all of arrays 111, or the number of bits per memory cell can vary for different banks 110. U.S. patent application Ser. No. 09/505,519, entitled "Multi-Bit-Per-Cell Non-Volatile Memory With Maximized Data Capacity", describes a memory storing different numbers of bits per cell in different arrays and is hereby incorporated by reference in its entirety.

For a memory access, memory control unit 120 generates bank select signals to select one of the banks 110. Address signals from the memory control unit 120 then select a selected memory cell in a selected sector of a selected array 111 of the selected bank 110.

For a write operation, memory control unit 120 also provides a data value via global data bus 152 to the write circuit 116W for the selected bank. The control circuit 119 for the selected memory bank 110 enables operation of the write circuit 116W associated with the selected array. Control circuits 119 for unselected banks disable the write circuits in the unselected banks. In the embodiment of FIG. 1, a converter 117W converts the multi-bit data signal from global data bus 152 to an analog voltage, and write circuit 116W is a multi-level analog write circuit that programs the threshold voltage of the selected memory cell to a target threshold voltage representing the analog voltage. The erase/write/read circuit 115 connected to the selected array generates the programming voltages necessary to program the selected memory cell to the target threshold voltage. Analog/ multi-level read and write circuits are known in the art and described, for example, in U.S. Pat. No. 5,694,356, which is hereby incorporated by reference in its entirety. The particular type of write circuit used is not critical to the invention.

For a read operation, memory control unit 120 again generates the bank select signal and the address signal to select a bank, an array in the selected bank, a sector of the selected array, and a memory cell in the selected sector. The control circuit 119 for the selected bank 110 directs the associated erase/write/read circuit 115 to read the threshold voltage of the selected memory cell. In the embodiment of FIG. 1, the read circuits include an analog/multi-level read circuit 116R and a converter 117R. Read circuit 116R provides to converter 117R an analog signal representing the threshold voltage of the selected memory cell, and converter 117R outputs a multi-bit digital signal to data bus 152. Memory control unit 120 receives the multi-bit digital signal and extracts or collects data for output to the external system.

Memory 100 can be varied in many ways. Parallel or pipelined operations can take place among memory banks 110 or within the same memory bank 110. For example, instead of writing one multi-bit data value at a time, multiple data values can be written in parallel using one bank 110 or two more banks 110 in parallel. Alternatively, memory control unit 120 can operate banks 110 in a pipelined fashion by starting a write or read operation in an array 111 before a previously started write or read operation in that or another memory array 111 is complete. Parallel or pipelined write and read operations provide a higher bandwidth when recording or playing back a serial data stream. U.S. patent application Ser. No. 09/434,588, entitled "High Bandwidth Multi-Level Flash Memory Using Dummy Memory Accesses To Improve Precision When Writing Or Reading A Data Stream," which is hereby incorporated by reference in its entirety, describes non-volatile multi-bit-per-cell memories employing pipelined accesses to achieve high bandwidth.

As described more fully below, an address mapping circuit 140 receives an address signal VADDR from a system incorporating memory 100 and generates an address signal PADDR for use inside memory 100. Address signal VADDR represents a virtual or logical address that the external system uses to identify data, and address signal PADDR indicates a physical address identifying the memory cells in memory 100 that store the data identified by the address signal VADDR. In memory 100, the mapping between address signals VADDR and PADDR can change after each refresh operation.

A refresh timer 130 indicates when a refresh operation is due. In one embodiment of the invention, refresh timer 130 includes a counter or register that is initialized with a current time count during start up of memory 100. In alternate embodiments, the external system periodically updates the current time in refresh timer 130, or memory 100 increments the current time count according to an input clock signal. Non-volatile storage in memory 100 stores one or more stored time counts indicating the last time a refresh operation was performed on memory 100 or on a particular portion of memory 100 such as a bank 110, an array 111, or a sector. In one embodiment of the invention, an erase operation erases an entire array 111, and after each time one or more of arrays 111 is erased, the time count from refresh timer 130 is written into the erased array or arrays. When the difference between a stored time count and the count in refresh timer 130 corresponds to the refresh interval $T_R$ for memory 100, a refresh operation is due. When a refresh operation is due, arbitration logic 135 directs memory control unit 120 to perform a refresh operation if pending data access operations are complete and the refresh operation does not unduly hamper required use of memory 100. After a refresh operation has started, arbitration logic 135 can temporarily halt all user instructions by sending a busy signal to the external system.

External time-keeping circuits can replace the functions of refresh timer 130, to save circuit area in memory 100. In particular, memory 100 can include one or more input terminals for signals that starts refresh operations. The duration of a refresh operation is relatively short (typically several minutes for a complete refresh of a 64-Mbyte memory, which provides about an hour of CD-quality MP3 music). Accordingly, periodic refresh operations for all or parts of memory 100 should not cause the user any significant inconvenience. Furthermore, the OEM or the user can program memory 100 or the external system to limit refresh operations to times when the user would normally not use memory 100, e.g., late at night or very early in the morning. The users also have the option to allow normal operation, and defer the refresh operation, by manually overriding arbitration logic 135.

Arbitration logic 135 updates an external system controller (not shown) when memory 100 is busy (during a refresh operation) or when memory 100 becomes available to start a record or play operation. Logic 135 also forces memory 100 to complete a record or play operation before starting a refresh operation. Arbitration logic 135 updates the configuration information for address mapping circuit 140 to reflect the new address of the modified storage locations, which a refresh operation may cause as described below. Alternatively, memory control unit 120 can send the revised address information to the system controller, which eliminates the need for address mapping circuit 140.

Refresh operations can be performed with or without use of a data buffer 122. In FIG. 1, data buffer 122 is a volatile memory array such as an SRAM array, and memory control unit 120 uses buffer 122 for data being input to memory 100 for storage or being read out of memory 100. Buffer 122 can also be used in refresh operation if buffer 122 can store at least one sector of data. For a refresh operation using buffer 122, memory 100 reads the data from a sector, stores the data in buffer 122, erases the sector, and re-writes the data from buffer 122 back into the erased sector. In the reading of memory cells, the threshold voltages, which may have drifted are converted to digital values so that the re-writing sets the threshold voltages back to their ideal values for representing the data value. Accordingly, re-writing eliminates any previous threshold voltage drift, and the threshold voltages remain in tight ranges around the target threshold voltage values.

If the refresh operation uses the same buffer memory 122 required for data input/output, arbitration logic 135 disables data input or output during the refresh operation. Alternatively, memory 100 can include an I/O buffer data buffer 122 and a refresh buffer 124 to permit data input or output during a refresh operation. For example, the arrays 111 other than the array containing a sector being refreshed, can be accessed normally through I/O buffer 122 during refresh of the requested sector. Arbitration logic 135 can interrupt the refresh operation to permit access of the array containing the sector selected for the refresh operation. Such an access is a normal access of the array unless the access is to the selected sector after erasing of that sector has begun. After erasing of a sector has begun, the access can be redirected to refresh buffer 124, which contains the data read from the sector being erased.

Figures 2A, 2B, 2C:
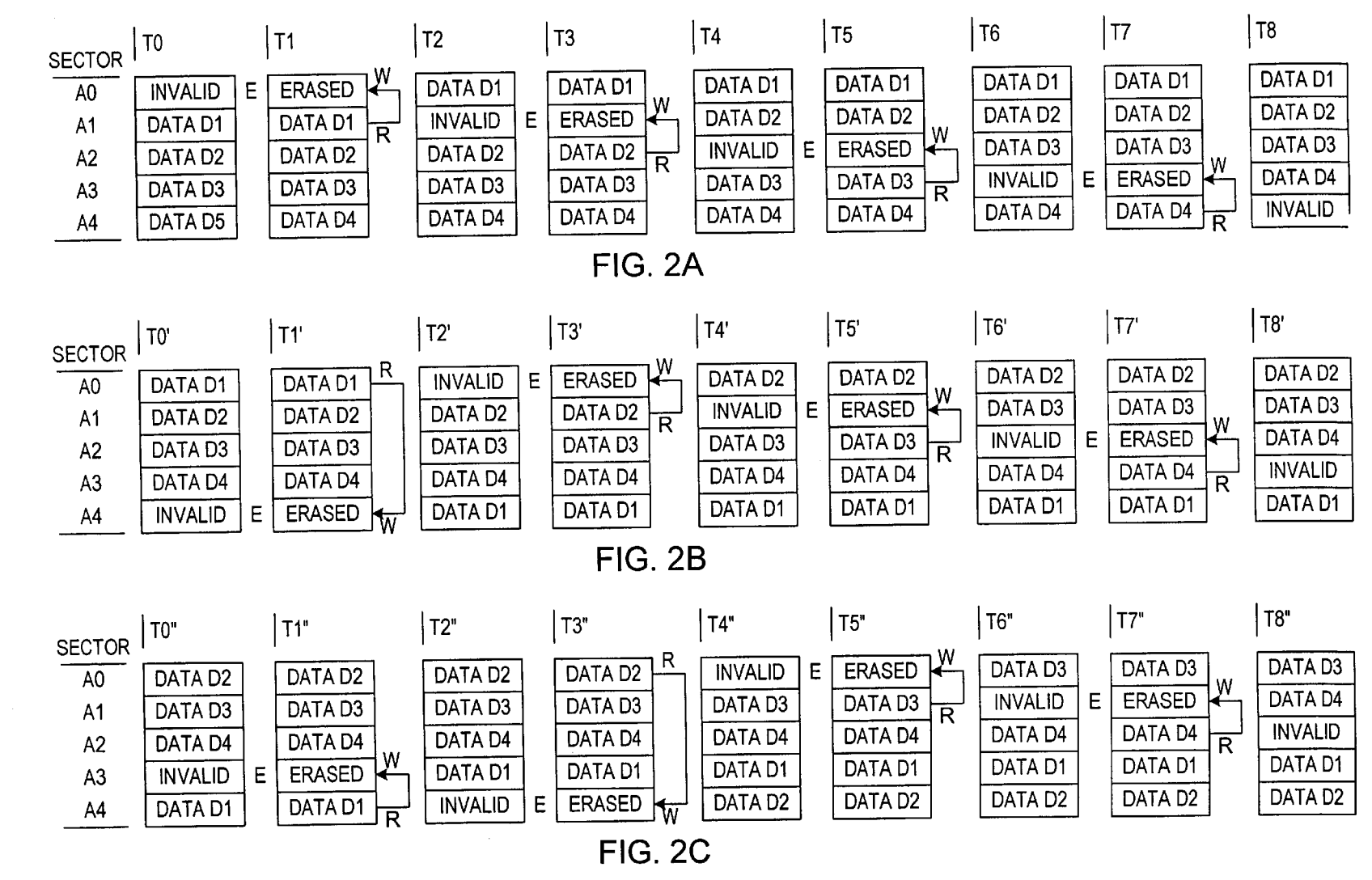

Instead of using a data buffer, a refresh operation can directly write data from one memory cell to another memory cell. FIG. 2A illustrates an embodiment of a refresh operation for a single array. The illustrated embodiment of the refresh operation is merely an example of one possible process. Other embodiments can vary, for example, in the order in which sectors are refreshed.

For ease of illustration, the array in FIG. 2A has five sectors A0 to A4. At a time T0, sectors A1 to A4 contain valid data D1 to D4, but sector A0 is unused or not storing valid data. With this configuration, values of virtual address signal VADDR only correspond to sectors A1 to A4, and sector A0 cannot be accessed from outside memory 100. A refresh operation begins at time T0 by erasing sector A0, which stores invalid data. At a time T1, after erasing sector A0, data D1 is read from sector A1 and written to erased sector A0. The read and write operations can be conducted in an interleaved fashion so that writing a data value to a memory cell in sector A0 immediately follows reading the value from a memory cell in sector A1. By a time T2, all data D1 is stored in sector A0, and data in sector A1 is considered invalid. Between time T2 and a time T3, sector A2 is erased. Data D2 is read from sector A2 and written to sector A1 between times T3 and T4. The refresh operation continues in this fashion by erasing sector A2 beginning at time T4, transferring data D3 from sector A3 to sector A2 beginning at time T5, erasing sector A3 beginning at time T6, and transferring data D4 from sector A4 to sector A3 beginning at time T7.

At a time T8, the refresh operation is complete, sectors A0 to A3 respectively store data D1 to D4, and data in sector A4 is considered invalid. With this new configuration, values of virtual address signal VADDR only correspond to sectors A0 to A3, and sector A4 is inaccessible from outside memory 100. Since the refresh operation of FIG. 2A moved data D1 to D4 to different sectors, address mapping circuit 140 must account for the new physical addresses of the data and change the mapping of virtual address signal VADDR to physical address signal PADDR.

With this embodiment of the invention, the sector read for writing into an erased sector is a sector that follows the erased sector in a cyclical order. Using this method, the inaccessible sector, which stores invalid data, cyclically shifts physical position each time the content of the array is refreshed. FIGS. 2B and 2C illustrate the next two refresh operations for the same array as in FIG. 2A. Presuming that data D1 to D4 is kept unchanged for a long period of time, the refresh operation of FIG. 2B begins after a refresh interval. (Selection of the duration of the refresh interval for a memory is further described below.) In a similar manner to that described above, the refresh operation of FIG. 2B erases sectors A4, A0, A1, and A2 beginning at respective times T0', T2', T4', and T6' and transfers data D1, D2, D3, and D4 from respective sectors A0, A1, A2, and A3 to sectors A4, A0, A1, and A2 beginning at respective times T1', T3', T5', and T7'. The refresh operation of FIG. 2C erases sectors A3, A4, A0, and A1 beginning at respective times T0", T2", T4", and T6" and transfers data D1, D2, D3, and D4 from respective sectors A4, A0, A1, and A2 to sectors A3, A4, A0, and A1 beginning at respective times T1", T3", T5", and T7".

After each refresh operation following the scheme of FIGS. 2A, 2B, and 2C, the respective physical addresses for sector-size data block D1, D2, D3, and D4 are the sum of respective fixed offsets and a base address corresponding to the end of the sector that is externally inaccessible. Sums taking the sector address beyond the end of the array wrap back to the beginning of the array in a cyclic fashion. The refresh operation of FIG. 2A moves data D1, D2, D3, and D4 to sectors A0, A1, A2, and A3 and physical addresses offset from the base address of sector A0. The refresh operation of FIG. 2B moves data D1, D2, D3, and D4 from sectors A0, A1, A2, and A3 to sectors A4, A0, A1, and A2 and physical addresses offset from the base address of sector A4. The refresh operation of FIG. 2C moves data D1, D2, D3, and D4 to sectors A3, A4, A0, and A1 and physical addresses offset from the base address of sector A3.

Equation 1 indicates a mapping of the virtual address VADDR to a physical address ADDR in a system using the refresh scheme of FIGS. 2A, 2B, and 2C.

$$PADDR = PBAA + (VADDR - VBAA + OIES) \; MOD \; (ArraySize) \qquad \text{Equation 1:}$$

In Equation 1, PBAA and VBAA are respectively the physical and virtrual base addresses of the target array. OIES is the offset from the physical base address PBAA to the end of the sector that is externally inaccessble. ArraySize indicates the physical size of the target array.

To implement the above refresh scheme in memory 100 of FIG. 1, a non-volatile register indicates which sector of an array is externally inaccessible. Memory control unit 120 loads the sector number from the non-volatile register into a sector counter and begins a refresh operation by erasing the sector that the sector counter identifies. Then, memory control unit 120 starts the transfer data from the sector that cyclically follows after the current sector count, and upon completion of the transfer, increments the sector count. Memory control unit 120 repeats the erasing, transferring, and incrementing operations until all data in the array is refreshed. The non-volatile register is then updated to reflect the final sector count in the sector counter when the refresh operation is complete.

Although the refresh method of FIGS. 2A, 2B, and 2C is described for the refresh of an array, the same refresh process can refresh an entire bank 110 or all of memory 100. In particular, a sequence or cyclical order can be established for the sectors in all of a bank or a memory. In FIGS. 2A and 2B, the cyclic ordering is according to the order the physical address of the sectors establish. In a bank or the memory, a better cyclic order permits use of the ability to perform simultaneous erase, read, and write operations of separate arrays.

Figure 3:
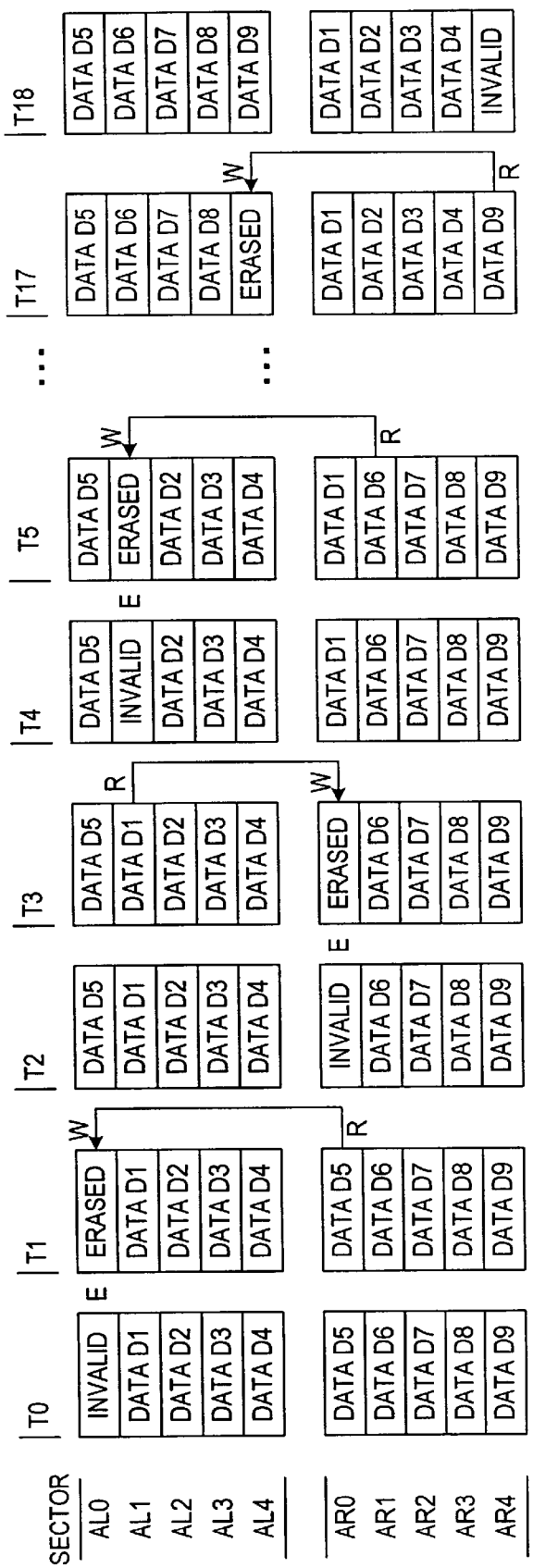
FIG. 3 illustrates a refresh operation performed two or more arrays of the memory of FIG. 1.

FIG. 3 illustrates a refresh operation that refreshes the content of a memory bank 110 in memory 100 of FIG. 1. Performing similar parallel or sequential refresh operations on all of banks 110 of memory 100 refreshes all data in memory 100. For ease of illustration, FIG. 3 shows five sectors AL0 to AL4 of a left array 111 and five sectors AR0 to AR4 of a right array 111 of a bank 110. Alternatively, the refresh could involve more than two arrays, and each array can include any number of sectors. The refresh operation of FIG. 3 is similar to the refresh operation of FIG. 2A in that a single sector for the two arrays remains unused and therefore not addressable through address signal VADDR. Having a single unused sector for two or more arrays increases the effective density of the memory. However, each array 111 could include its own unused sector if desired.

For the refresh operation, an erase operation begins at a time T0 on sector AL0, which initially is externally inaccessible. At time T1, a transfer of data D5 begins from sector AR0 in the right array to the erased sector AL0 in the left array. Unlike in FIG. 2A, the transfers in FIG. 3 read data from one array (e.g., the right array) and write data in another array. This saves time and is more efficient since separate arrays can perform simultaneous read and write operations. In FIG. 1, a by-pass 114 (typically a latch or register) simultaneously receives a data value from read circuit converter 117R and passes a data value to the converter 117W for simultaneous read and write operations. In contrast, the refresh operation of FIG. 2A interleaves reads and writes because a single array typically cannot conduct parallel read and write operations.

After time T1, the refresh operation continues transferring each sector-size data block to the physical sector last transferred. In one embodiment, the order in which sectors are transferred is such that in each array, the data blocks retain their original cyclic ordering. For example, the refresh operation of FIG. 3 transfers data blocks D1, D2, D3, and D4 to physical sectors to sectors AR0, AR1, AR2, and AR3, respectively, so that data blocks D1, D2, D3, and D4 are in a different array but retain their original order. Similarly, the refresh transfers data blocks D5, D6, D7, D8, and D9 to sectors AL0, AL1, AL2, AL3, and AL4, respectively. Maintaining cyclic ordering in each array simplifies the address conversions in address mapping circuit 140.

The sectors further have a global cyclical ordering that defames the order in which sectors are erased. In the global cyclical ordering, each sector in the right array follows a sector at the same position in the left array, and each sector in the left array follows a sector in the right array that is offset by the size of one sector. A similar cyclical ordering can be established for any number of arrays. For example, each sector except sectors in a first array follows a sector in the same position in a previous array, and each sector in the first array follows a sector in the last array that is offset by one sector. The refresh operation starts by erasing the externally inaccessible sector and transferring data from the next sector in the global order to the erased sector. The refresh operation proceeds to erase sectors in the global order.

For a refresh of a bank, address conversions may be simplified by making one array in the bank bigger than the other array. For example, the left array 111 in a bank 110 can include $2^N+1$ sectors with one of the sectors being externally inaccessible, while the right array 111 in the bank 110 includes $2^N$ sectors all of which are accessible. In this embodiment, each bank can store $2^{(N+1)}$ sectors of valid data, which is a convenient number for binary address signals. In particular, virtual address signal VADDR can include a set of most significant bits (a bank number) that identifies a bank, a set of least significant bits (a cell address) that identifies a memory cell within a sector, and a set of remaining bits (a sector number) that identifies a sector. In this case, address mapping circuit 140 uses the bank number and cell address from address signal VADDR without change and converts the sector number as required for the current configuration of data in the bank.

A disadvantage of asymmetric arrays is not symmetric and typically does not efficiently use integrated circuit area. Additionally, a cyclic order for the sectors requires that at least one sector in the larger array to follow another sector the same array. Accordingly, if a cyclic ordering is used for data transfers, at least one of the transfers in most refresh operations will be back into the same array, and parallel read and write operations cannot be used for those transfers. However, each refresh operation can reverse the transfers of the previous refresh operation as illustrated in FIGS. 4A and 4B.

Figure 4A:
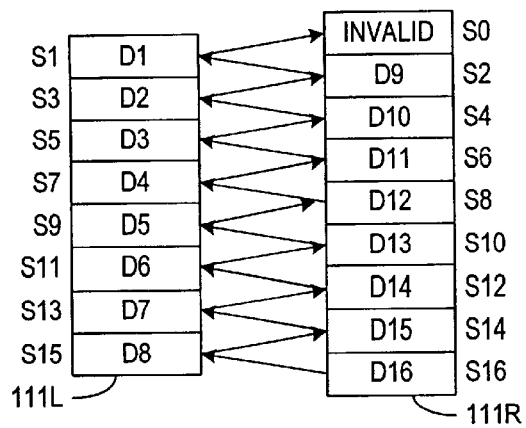
FIGS. 4A, 4B, and 4C illustrate refresh operations that switch a memory back and forth between two storage configurations.

FIG. 4A illustrates a left array 111L and a right array 111R of a bank. Array 111L contains eight sectors S1, S3, S5, S7, S9, S11, S13, and S15, and the right array 111R contains nine sectors S0, S2, S4, S6, S8, S10, S12, S14, and S16. The reference numbers S0 to S16 of the sectors correspond to their global ordering. Initially, left array 111L holds eight data blocks D1 to D8, and right array 111R holds eight data blocks D9 to D16 with sector S0 is externally inaccessible. Arrows in FIG. 4A indicate the direction of data transfer for a refresh operation starting with the transfer of data D1 from sector S1 to sector S0 after sector S0 is erased. The refresh operation erases sectors S0 to S15, in that order, and transfers data from the next sector to erased sectors following the erase operation. All of the transfers in FIG. 4A are between arrays 111L and 111R so that all transfers can employ simultaneous read and write operations.

Figure 4B:
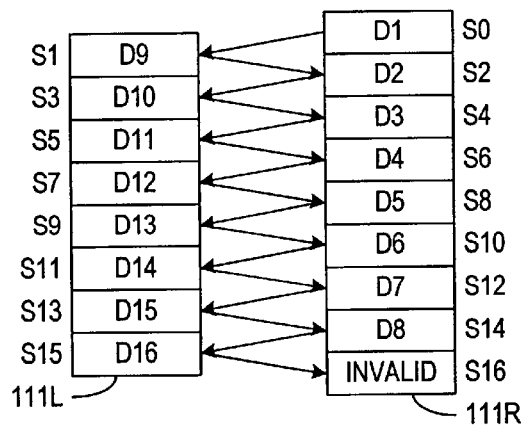

FIG. 4B shows the location of data after the refresh operation of FIG. 4A, and the arrows in FIG. 4B indicate the data transfers for the next refresh operation. Instead of following the order of sectors S0 to S16 cyclically, the refresh operation of FIG. 4B uses a reverse order to undo the effect of the previous refresh operation of FIG. 4A. Accordingly, the refresh operation of FIG. 4B restores data D1 to D16 to the positions shown in FIG. 4A. All subsequent refresh operations alternate between the refresh operation of FIG. 4A and the refresh operation of FIG. 4B. This embodiment can simplify address mapping circuit 140 since only two different address mappings are required (one where sector S0 is externally inaccessible and one where sector S16 is externally inaccessible). However, the refresh operations erase sectors S0 and S16 half as many times as the other sectors. After many cycles, sectors S0 and S16 may perform differently due to different endurance histories. To avoid the difference in endurance history among the different sectors, an erase operation and a dummy write operation can be performed on sector S16 after the refresh operation of FIG. 4A, and an erase and a dummy write operation can be performed on sector S0 after the refresh operation of FIG. 4B.

Figure 4C:
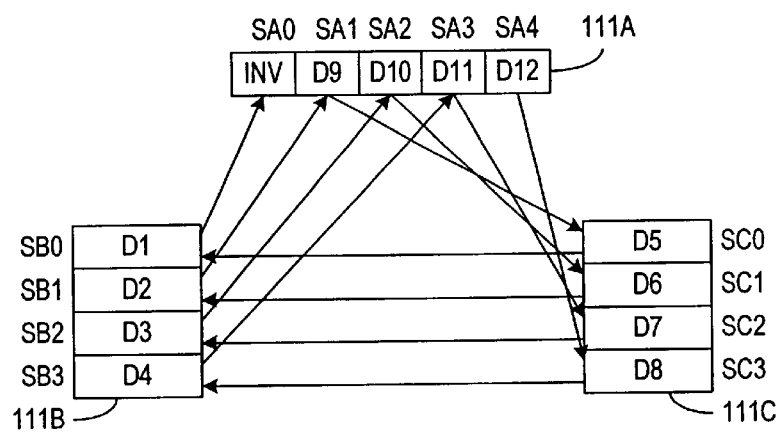

Although the refresh operations of FIGS. 4A and 4B are described for two arrays, the same principles can be employed for any number of arrays and in particular for all of the arrays in a memory, where one of the arrays includes an additional sector. FIG. 4C illustrates a refresh operation where an array 111A contains one more sector than do arrays 111B and 111C. The refresh operation starts by erasing an externally inaccessible sector SA0 in array 111A and transferring data D1 from sector SB0 in array 111B to the erased sector SA0. The refresh operation then erases sector SB0 in array 111B, and writes data D5 from sector SC0 in array 111C to erased sector SB0. The refresh operation continues in erasing and transferring data in a forward ordering. In the forward ordering, sectors SB0 to SB3 in array 111B respectively follow sectors SA0 to SA3 of array 111A. Sector SC0 to SC3 in array 111C respectively follow sectors SB0 to SB3 of array 111B. Sector SA1 to SA4 in array 111A respectively follows sectors SC0 to SC3 of array 1113. Upon completion of the refresh operation data D1 to D4 from array 111C is in array 111A, data D5 to D8 from array 111C is in array 111B, and data D9 to D12 from array 111A is in array 111C. The next refresh operation following the refresh of FIG. 4C starts with erasing the externally-inaccessible sector SA4 and transfers data using a reverse ordering that puts data D1 to D12 back in the locations shown in FIG. 4C.

Figure 5:
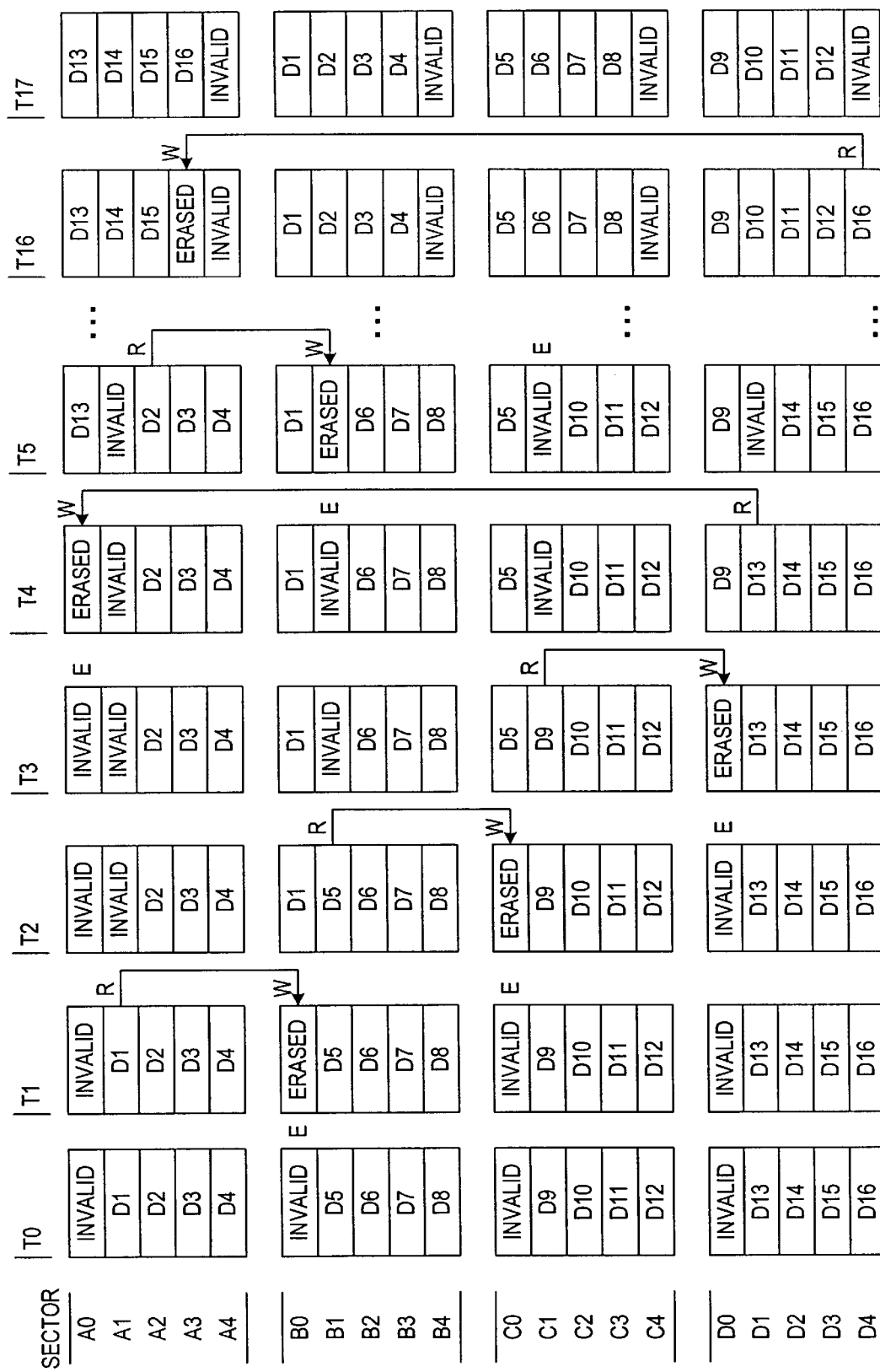
FIG. 5 illustrates a refresh operation involving three or more arrays of the memory of FIG. 1.

FIG. 5 illustrates a refresh operation involving simultaneous erase, read, and write operation. This type of refresh operation requires three or more arrays. Again, the timing of FIG. 5 illustrates one of the many possible scenarios. The illustrated scenario employs four arrays A, B, C, and D (two banks 110), and an order for transferring sector-size data blocks maintains the cyclic order of the blocks in each array 111. In FIG. 5, each array A, B, C, and D includes five sectors, and one sector in each array is unused and externally inaccessible. At a time T0, an erase of a sector B0, which is in array B and contains invalid data, starts. Between times T1 and T2, an externally-inaccessible sector C0 in array C is erased, the memory cells in a sector A1 in array are read, and the data read from sector A1 are written into erased sector B0. The erase, read, and write operations can be simultaneous to minimize the time required for the refresh operation. In sixteen time intervals beginning at times T1 to T16, the refresh operation transfers data blocks D1 to D16 to new sectors and in the process renews the accurate placement threshold voltages representing the data.

The overhead for one unused sector per array is negligible in a typical high-density Flash memory chip. For example, a 64-MByte or 512-Mbit memory including 128 Meg cells storing four bits per cell typically includes more than 1000 sectors or more than 64 sectors per array with 16 arrays. In such a memory, the unused sectors reduce the number of usable memory cells about 1.5%, but the refresh operations help keep the threshold voltages in small windows thereby allowing reliable storage of more bits per cell.

Figure 6:
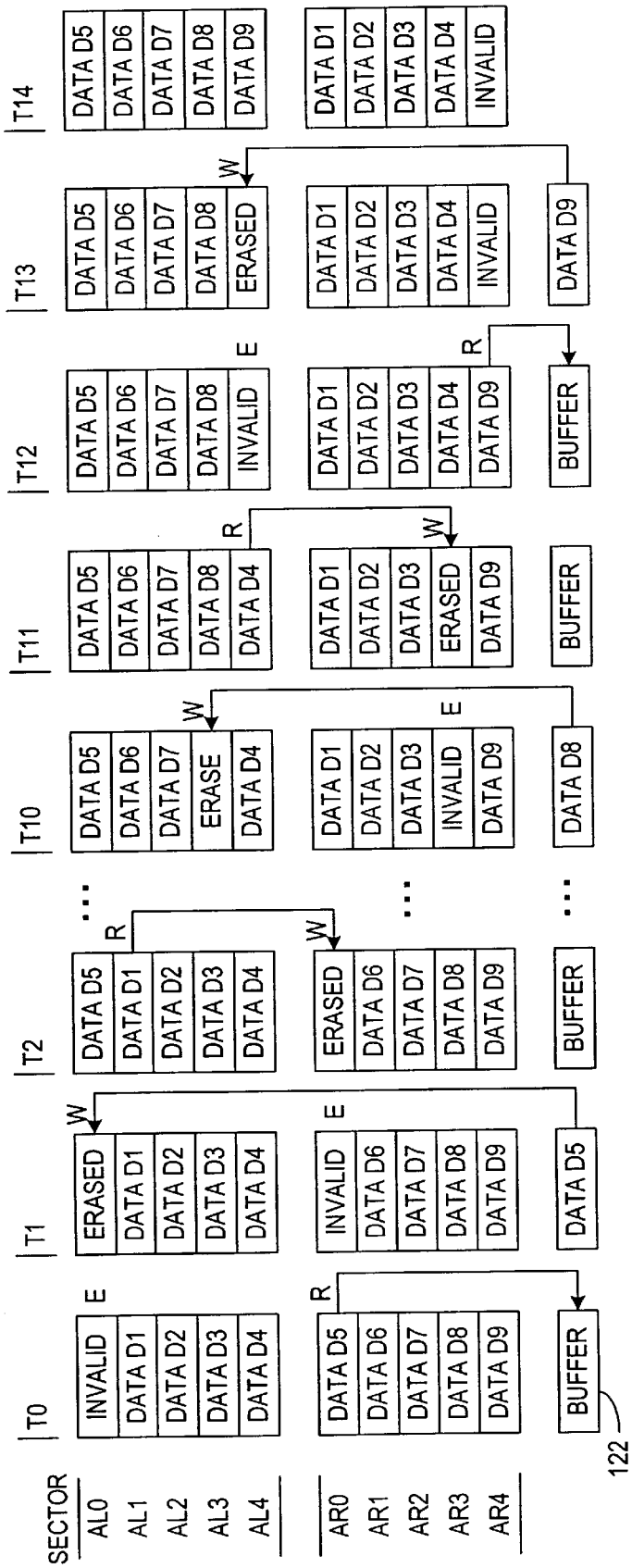
FIG. 6 illustrates a refresh operation using a buffer to decrease the time required for the refresh operation.

As described above, a refresh operation can use a data buffer and store refreshed data back in the same memory locations. In accordance with another aspect of the invention, a refresh operation that shifts the storage locations of data can employ a volatile data buffer to reduce the time required for the refresh operation. FIG. 6 illustrates a refresh operation of a data bank that uses a buffer to reduce the time required to achieve the same result as the refresh operation of FIG. 3. The arrays and bank in FIG. 6 are the same as those described above in regard to FIG. 3, but the refresh operation of FIG. 6 also uses buffer 122. Starting at time T0, the refresh operation simultaneously erases an invalid sector AL0 in the left array while reading data D5 from sector AR0 of the right array into the buffer 122. At time Ti, the refresh operation writes data D5 from buffer D5 into the erased sector AL0 in the left array and simultaneously erases sector AR0 in the right array. At time T2, the refresh operation reads data D1 from sector AL1 in the left array and simultaneously writes data D1 into the erased sector AR0 in the right array. The size of the sectors can be selected so that erasing, writing, or reading of a sector requires the same sector access interval. With this size selection, the refresh operation of FIG. 6 requires three sector access intervals to refresh two sectors. In contrast, the refresh operation of FIG. 3 requires four sector access intervals to refresh two sectors. The refresh operation of FIG. 6 thus provides about a 25% decrease in the refresh time, depending on the actual read, write, and erase times of the memory.

Another embodiment of the invention allows refresh operations that switch the storage locations for data but do not require unused sector. One such refresh operation simultaneously reads the data from two sectors in two different arrays (e.g., in the left and right arrays of a bank) and temporary stored the data in left and right halves of data buffer 122. (A data buffer for external input and output of data typically has twice the capacity of a sector because in the normal writing, one half of the buffer accepts new data, while the other half provides the data being written). The refresh operation then simultaneously erases the two just-read sectors. Afterwards, the refresh operation writes the data that originated from the left array to the erased sector in right array and simultaneously writes the data that originated from the right array to the erased sector in the left array. This refresh operation advantageously avoids repetitive writing of a high (or low) threshold voltage to the same cell. Repeated writing of the same value can change the endurance performance of a memory cell.

The maximum tolerable threshold voltage Vt drift and the data-retention characteristics of a memory determine the time interval $T_R$ between refresh operations. The memory is screened for bad/defective bits, which have worse-than-typical data retention characteristics. Floating-gate Flash memory cells typically exhibit a slow intrinsic charge-loss that changes the threshold voltage at a rate of about 70 $\mu$V per hour at 125° C., with an activation energy $E_a$ of about 1.4 eV. With these assumptions and a maximum tolerable threshold voltage drift of 25 mV, the worst-case refresh interval $T_R$ is about 250 hrs or about 10 days. With a maximum tolerable threshold voltage drift of 10 mV, the worst-case refresh interval $T_R$ is about 100 hrs or about 4 days. With the worst-case interval between refresh being greater than four days, the refresh has a very low duty-cycle and is virtually transparent to the system or user of the memory. This compares to a typical dynamic random access memory (DRAM) which has a refresh interval of about 10 ms. Similarly, the extra current consumption required for refresh operations is insignificant when compared to the overall operating power of the memory.

Each refresh of a sector requires erasing and writing the contents of the sector and thereby consumes an endurance cycle. Table 1 shows the percentage of the total endurance cycles that refresh operations consume in a memory having lifetime of 10 years and an endurance specifications of $10^4$ to $10^5$ cycles, for different refresh intervals $T_R$.

TABLE 1

| Refresh Interval | No. of Refresh Cycles in 10 years | % of $10^4$ Cycles | % of $10^5$ Cycles |
| --- | --- | --- | --- |
| 1 day | 3650 | 36.5% | 3.7% |
| 4 Days | 913 | 9.1% | 0.9% |
| 1 Week | 522 | 5.2% | 0.5% |
| 1 Month | 120 | 1.2% | 0.1% |

Most Flash memory devices on the market today, with either one-bit or two-bit per cell, have an endurance greater than $10^5$ cycles. However, for most practical non-volatile applications, such as portable digital cameras, MP3 music players, and temporary file storage, etc., the maximum number of accumulated endurance cycles is typically less than 5,000 cycles in its 10-year lifetime. As shown above, with one refresh operation every four days, and a very conservative endurance of $10^4$ cycles (e.g., if a 4-bit-per-cell Flash memory requires the endurance specification to be tighter), the on-chip refresh feature consumes less than 10% of the overall endurance cycle budget.

In accordance with yet another aspect of the invention, instead of providing an unused sector in an array for use in a refresh operation, one of the arrays 111 (FIG. 1) is inaccessible via the virtual address signal VADDR input to memory 100. In this embodiment, a refresh operation erases the inaccessible array 111 and then transfers data from another array 111 into the array just erased. The read and write operations for the transfer are in different arrays and can be simultaneous. Upon completing the refresh operation, address mapping circuit 140 changes the mapping of virtual address signal VADDR so that originally inaccessible array is accessible, and the last array read from is inaccessible. The refresh operation can be limited to only those arrays containing valid data at the time of the refresh operation. In particular, if an accessible array 111 is not storing data when a refresh operation starts, memory management unit 120 can skip the transfer associated with reading from the unused array and the preceding erase of the destination array. Such a refresh scheme can effectively be employed with the sectorless memory architecture described in U.S. patent application Ser. No. 09/518,608, entitled "Sectorless Flash Memory Architecture", which is hereby incorporated by reference in its entirety.

Although the invention has been described with reference to particular embodiments, the description is only an example of the invention's application and should not be taken as a limitation. Various adaptations and combinations of features of the embodiments disclosed are within the scope of the invention as defined by the following claims.

I claim:

1. A non-volatile memory comprising:
   a plurality of memory cells;
   erase, write, and read circuitry coupled to the memory cells;
   a refresh timer;
   a memory management unit coupled to control the erase, write, and read circuitry, wherein in response to a signal from the refresh timer, the memory management unit directs the erase, write, and read circuitry to perform a refresh operation that includes reading data without generating a data signal for output from the non-volatile memory and writing the data to refresh threshold voltages of memory cells storing the data; and
   an address mapping circuit, wherein:
      the refresh operation reads the data from a first set of the memory cells and writes the data to a second set of memory cells;
      before the refresh operation, the address mapping circuits converts an virtual address signal corresponding to the data to a first physical address that corresponds to the first set of memory cells; and
      after the refresh operation, the address mapping circuit converts the virtual address signal corresponding to the data to a second physical address that corresponds to the second set of memory cells.

2. The memory of claim 1, further comprising arbitration logic that stops the signal from the refresh timer from reaching the memory management unit during an external access of the memory cells.

3. The memory of claim 2, wherein the arbitration logic asserts a signal to prevent external access of the memory cells during the refresh operation.

4. A non-volatile memory comprising:
   a plurality of memory cells;
   erase, write, and read circuitry coupled to the memory cells;
   a refresh timer;
   a memory management unit coupled to control the erase, write, and read circuitry, wherein in response to a signal from the refresh timer, the memory management unit directs the erase, write, and read circuitry to perform a refresh operation that includes reading data without generating a data signal for output from the non-volatile memory and writing the data to refresh threshold voltages of memory cells storing the data; and
   an address mapping circuit operable in a first mode and a second mode, wherein
      in the first mode, the address mapping circuit makes a first subset of the plurality of memory cells accessible in response to an address signal input into the memory and a second subset of the plurality of memory cells inaccessible in response to the address signal; and
      in the second mode, the address mapping circuit makes the second subset of the plurality of memory cells accessible in response to the address signal and the first subset of the plurality of memory cells inaccessible in response to the address signal.

5. The memory of claim 4, wherein the address mapping circuit switches between the first and second modes in response to the refresh operation.

6. The memory of claim 4, wherein the plurality of memory cells are arranged in one or more arrays, the first subset of the plurality of memory cells being a first sector in one of the arrays, the second subset of the plurality of memory cells being a second sector in one of the arrays.

7. A non-volatile memory comprising
   a plurality of memory cells;
   erase, write, and read circuitry coupled to the memory cells;
   a refresh unit coupled to control the erase, write, and read circuitry, wherein when activated, the refresh unit directs the erase, write, and read circuitry to perform a refresh operation that includes reading data in the non-volatile memory and writing the data to different locations in the non-volatile memory; and
   an address mapping circuit operable in a plurality of modes, wherein:
      each mode corresponds to a different subset of the plurality of memory cells, and
      in each mode, the address mapping circuit makes the subset corresponding to that mode inaccessible in response to an address signal input into the memory.

8. The memory of claim 7, wherein the address mapping circuit switches among modes after each refresh operation.

9. The memory of claim 7, wherein the plurality of memory cells are arranged in one or more arrays, and each subset contains at least one sector from one of the arrays.

* * * * *